United States Patent
Shen et al.

(10) Patent No.: US 9,400,533 B2
(45) Date of Patent: Jul. 26, 2016

(54) ELECTRICAL CONNECTOR HAVING A HOUSING WITH A RETAINING DEVICE FOR SECURING A BRACKET

(71) Applicant: FOXCONN INTERCONNECT TECHNOLOGY LIMITED, Grand Cayman (KY)

(72) Inventors: Xue-Hai Shen, Kunshan (CN); Er-Ying Guo, Kunshan (CN); Wen-Jun Tang, Kunshan (CN); Xue-Wu Bu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/802,251

(22) Filed: Jul. 17, 2015

(65) Prior Publication Data
US 2016/0020540 A1   Jan. 21, 2016

(30) Foreign Application Priority Data

Jul. 18, 2014   (CN) .................. 2014 2 0398216 U

(51) Int. Cl.
| | |
|---|---|
| H01R 13/62 | (2006.01) |
| G06F 1/20 | (2006.01) |
| H01R 13/627 | (2006.01) |
| H01R 13/506 | (2006.01) |
| H01R 9/16 | (2006.01) |
| H01R 12/71 | (2011.01) |
| H01L 23/40 | (2006.01) |
| H01L 23/467 | (2006.01) |

(52) U.S. Cl.
CPC .............. *G06F 1/203* (2013.01); *H01R 13/506* (2013.01); *H01R 13/6271* (2013.01); *H01L 23/4093* (2013.01); *H01L 23/467* (2013.01); *H01L 2023/4062* (2013.01); *H01R 9/16* (2013.01); *H01R 12/716* (2013.01)

(58) Field of Classification Search
CPC .. H01R 13/62; H01R 13/627; H01R 13/6271; H01R 13/6272; H01R 13/6273; H01R 13/629
USPC .................. 439/351, 352–358, 266–270
See application file for complete search history.

(56) References Cited

U.S. PATENT DOCUMENTS

| | | | | |
|---|---|---|---|---|
| 6,130,820 | A | 10/2000 | Konstad et al. | |
| 6,319,037 | B1 * | 11/2001 | Lai ..................... | H01R 12/7005 361/801 |
| 6,394,831 | B1 * | 5/2002 | Bowers ................ | H05K 7/1431 439/327 |
| 6,517,369 | B1 * | 2/2003 | Butterbaugh ........ | H01R 12/707 439/327 |
| 7,371,097 | B1 * | 5/2008 | Pennypacker ..... | H01R 13/6275 439/327 |
| 8,113,863 | B2 * | 2/2012 | Vrenna ................ | H01R 12/721 439/327 |
| 8,246,373 | B2 * | 8/2012 | Lee .................... | H01R 12/7005 439/153 |
| 8,337,245 | B1 * | 12/2012 | Wang .................. | H01R 12/724 439/271 |

(Continued)

*Primary Examiner* — Chandrika Prasad
(74) *Attorney, Agent, or Firm* — Wei Te Chung; Ming Chieh Chang

(57) ABSTRACT

An electrical connector assembly comprises an electrical connector and a bracket for retaining a fan. The electrical connector includes an insulating housing, a plurality of contacts received in the housing and a retaining device retained on one end of the housing. Said retaining device includes a locking portion, one end of the housing defines an outside face, the locking portion located at an interior of the outside face. It can reduce the installation space of fixing the bracket.

6 Claims, 9 Drawing Sheets

(56) References Cited

U.S. PATENT DOCUMENTS

| | | | | |
|---|---|---|---|---|
| 8,422,226 | B2* | 4/2013 | Ye | G06F 1/20 361/695 |
| 8,550,836 | B2* | 10/2013 | Ma | G06F 1/185 439/328 |
| 2007/0004264 | A1* | 1/2007 | Brown | H05K 7/1405 439/351 |
| 2007/0093110 | A1* | 4/2007 | Park | G02F 1/13452 439/351 |
| 2014/0377971 | A1* | 12/2014 | Mathews | H01R 12/79 439/153 |
| 2015/0222029 | A1* | 8/2015 | Neu | H01R 13/62 439/159 |

* cited by examiner

ELECTRICAL CONNECTOR HAVING A HOUSING WITH A RETAINING DEVICE FOR SECURING A BRACKET

BACKGROUND OF THE INVENTION

1. Field of the Invention

The present invention relates to an electrical connector, and more particularly to an electrical connector with an improved retaining device assembled therein.

2. Description of the Related Art

U.S. Pat. No. 6,130,820 issued on Oct. 10, 2000, discloses an electrical connector including a fan, the fan is positioned adjacent to a memory card and a retaining device having three claws couples the fan to a mother board, and thus the fan can be held stably. However, the claw mounted on the mother board will take up a big space of the mother board.

Therefore, an improved electrical connector is highly desired to meet overcome the requirement.

BRIEF SUMMARY OF THE INVENTION

Accordingly, an object of the present invention is to provide electrical connector assembly having an improved retaining device.

In order to achieve above-mentioned object, an electrical connector assembly includes an electrical connector and a bracket for retaining a fan assembling with the electrical connector. The electrical connector includes an elongated insulative housing extending along a left-to-right direction, a plurality of conductive terminals retained in the insulative housing. The electrical connector defines a retaining device locked with the bracket, the insulative housing defines an end surface in the left-to-right direction, the retaining device defines a locking portion located at an interior of the end surface.

Other objects, advantages and novel features of the invention will become more apparent from the following detailed description of the present embodiment when taken in conjunction with the accompanying drawings.

DESCRIPTION OF PREFERRED EMBODIMENT OF THE INVENTION

Figure 1:
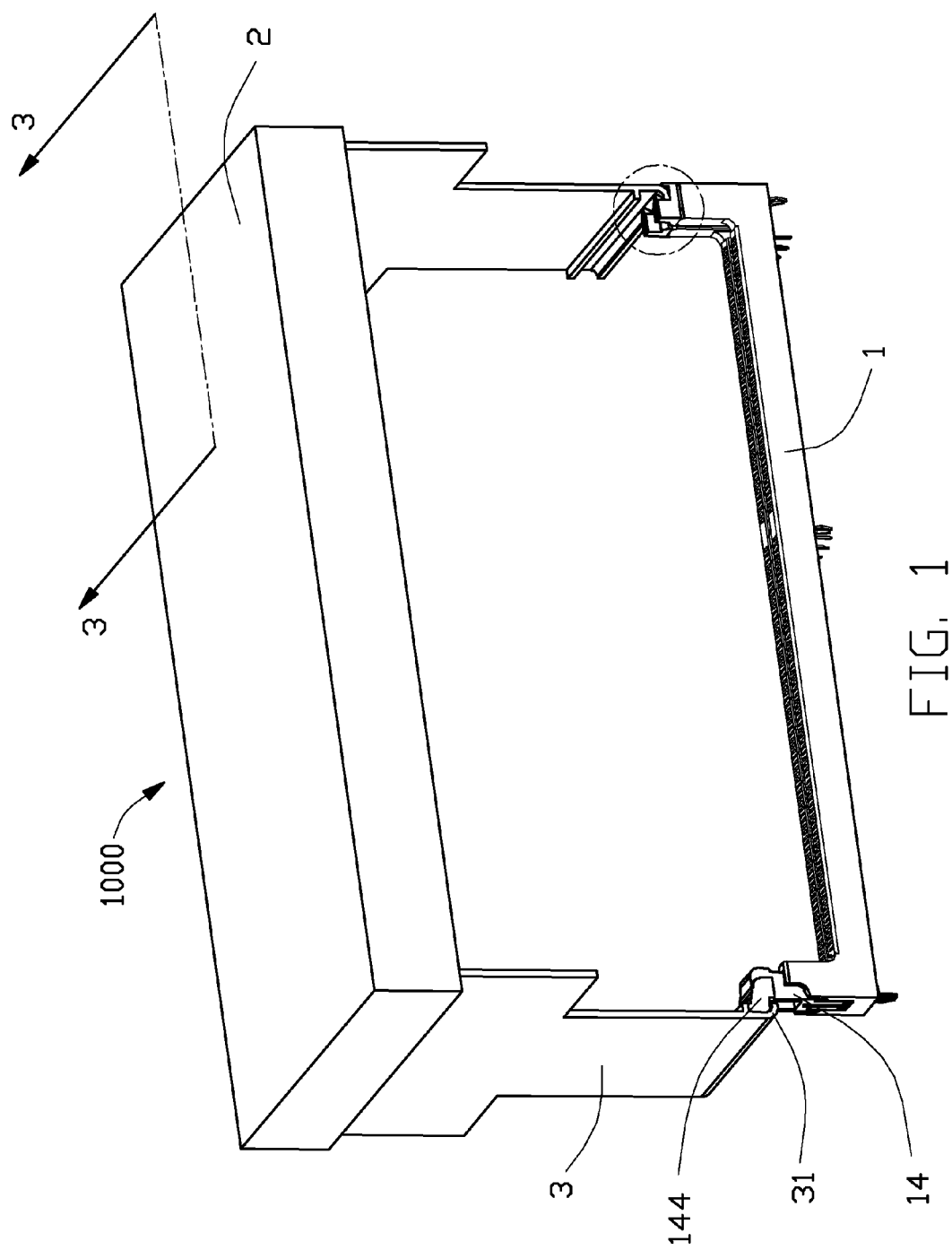
FIG. 1 is a perspective view of an electrical connector assembly in accordance with a first embodiment of the present invention.
Figure 2:
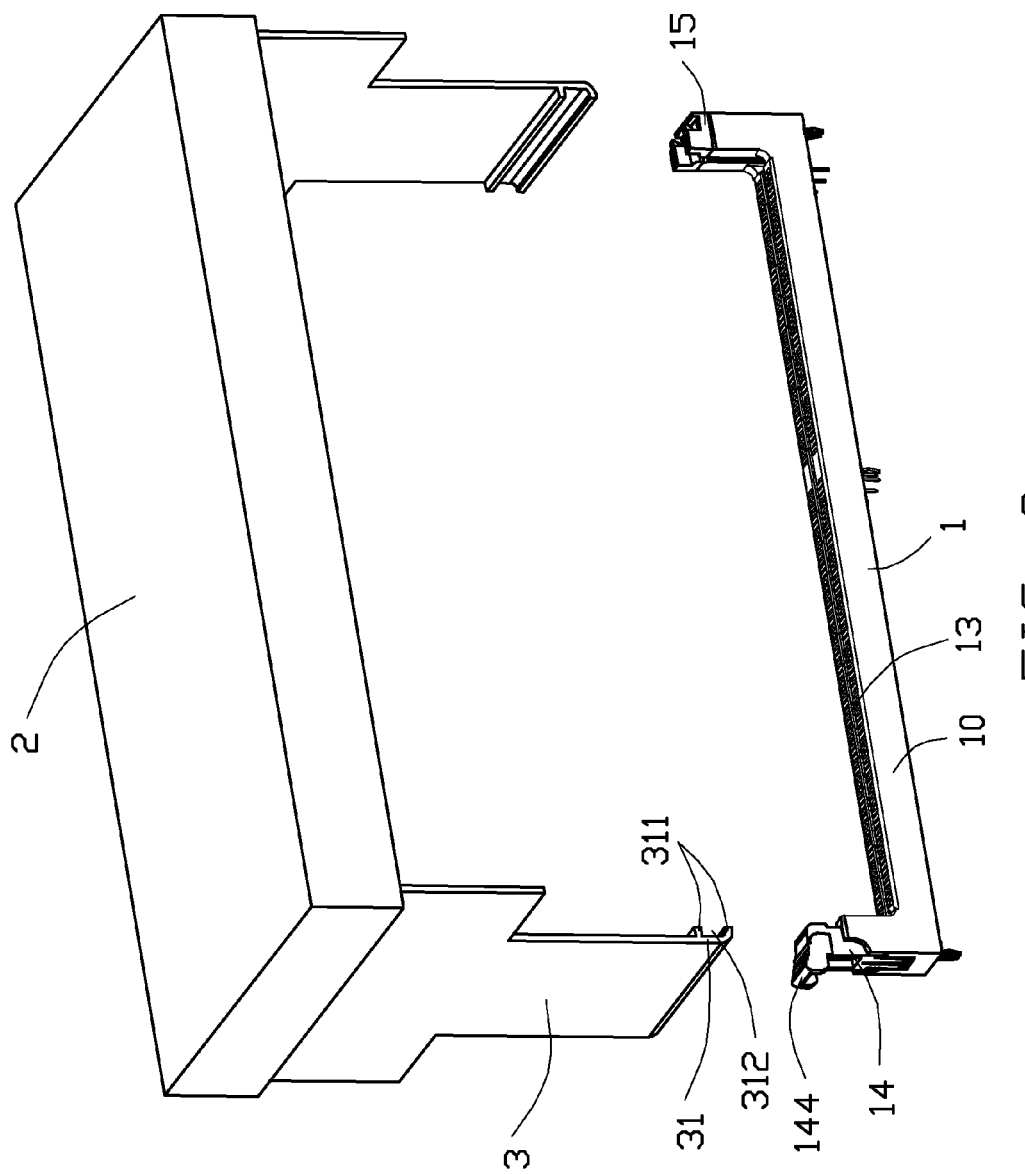
FIG. 2 is an exploded perspective view of the electrical connector assembly shown in FIG. 1.

Reference will now be made to the drawing figures to describe a preferred embodiment of the present invention in detail. Referring to FIG. 1 to FIG. 2, a electrical connector assembly 1000 includes an electrical connector 1 for inserting with a daughter card (not shown), a fan 2 located at a upper surface of the electrical connector 1, and a pair of brackets 3 located between the electrical connector 1 and the fan 2, the two brackets 3 used for supporting the fan 2.

Figure 3:
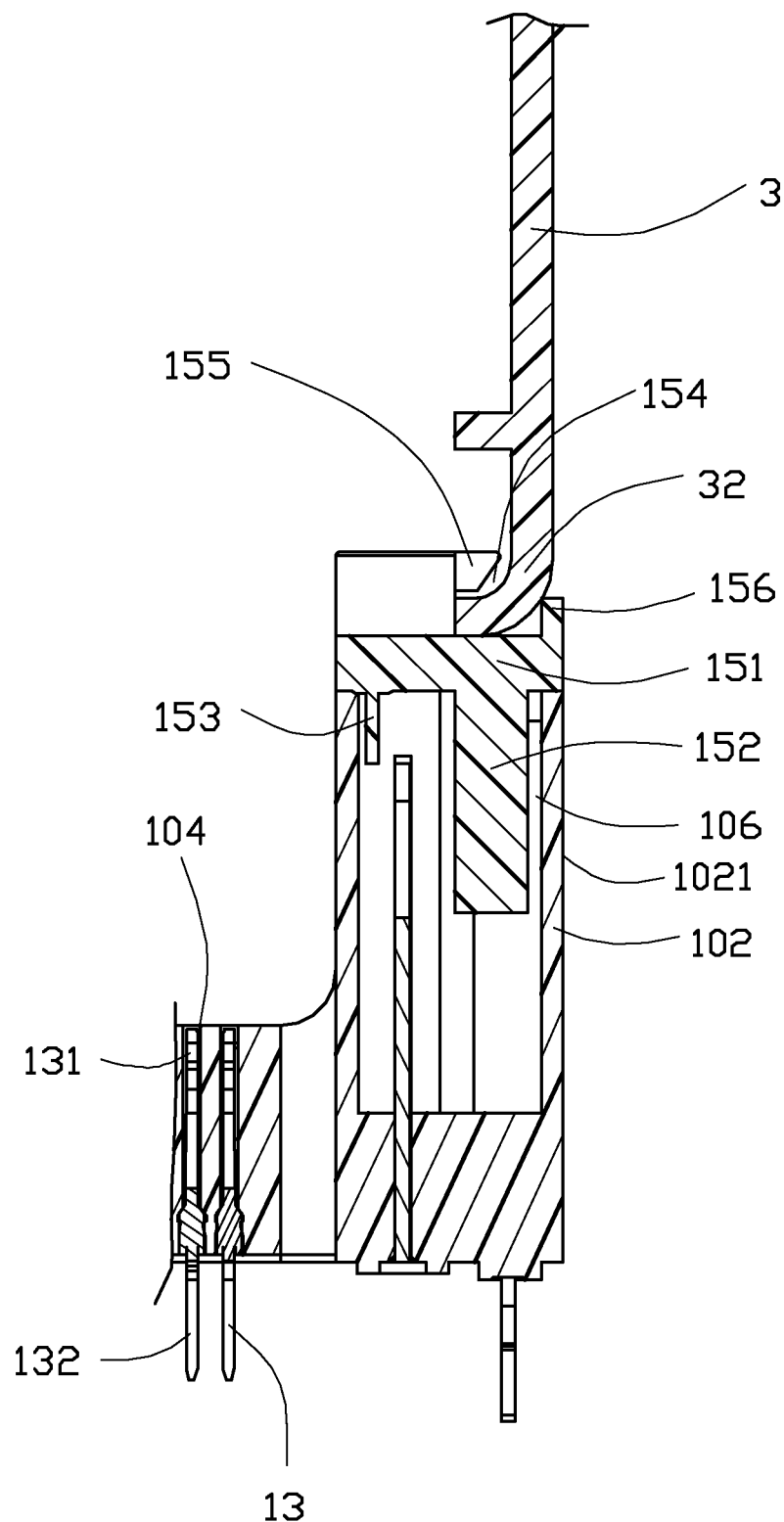
FIG. 3 is a cross-sectional view of the electrical connector assembly along line 3-3 of FIG. 1.
Figure 4:
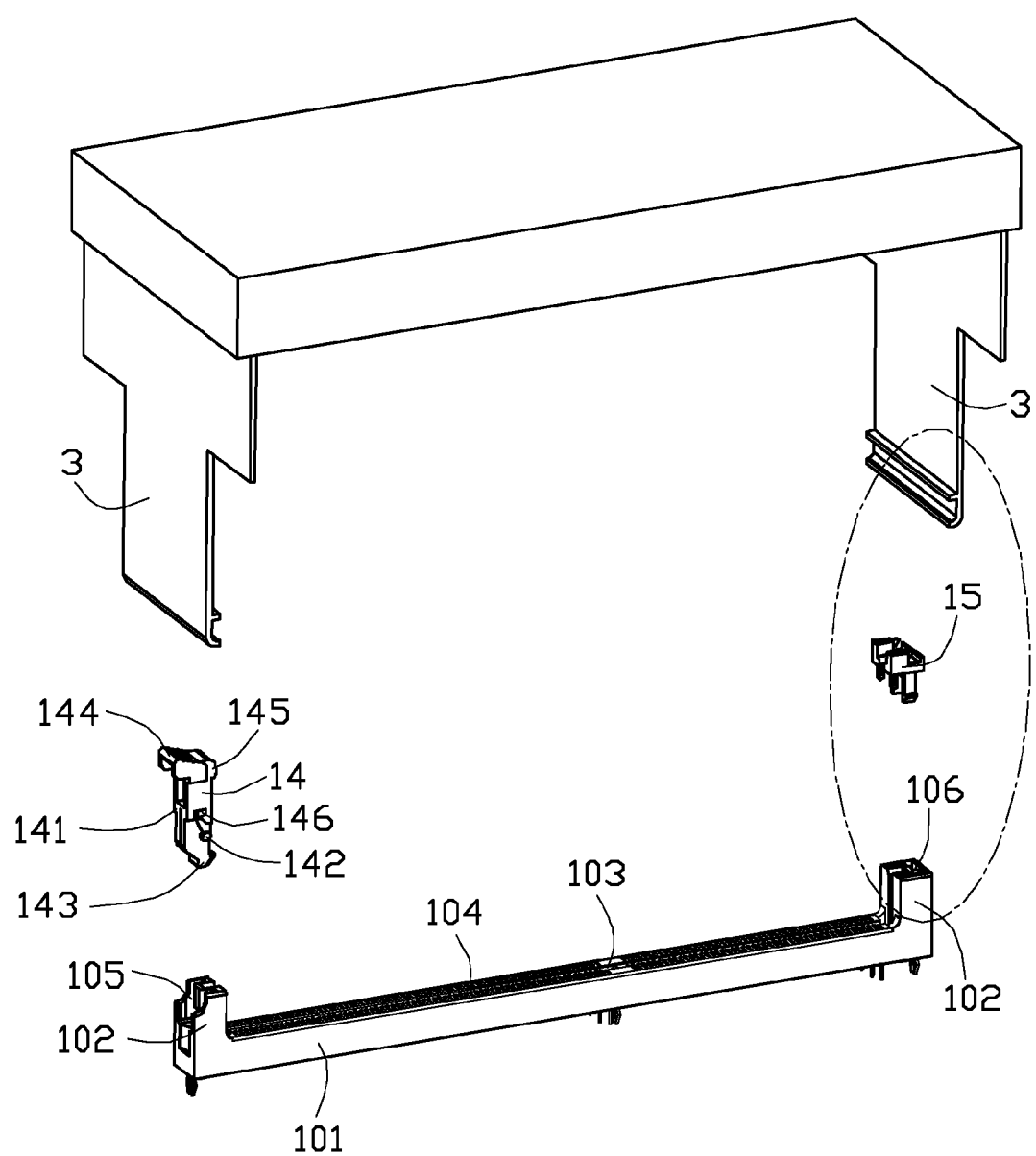
FIG. 4 is an exploded perspective view of the electrical connector assembly shown in FIG. 2.
Figure 5:
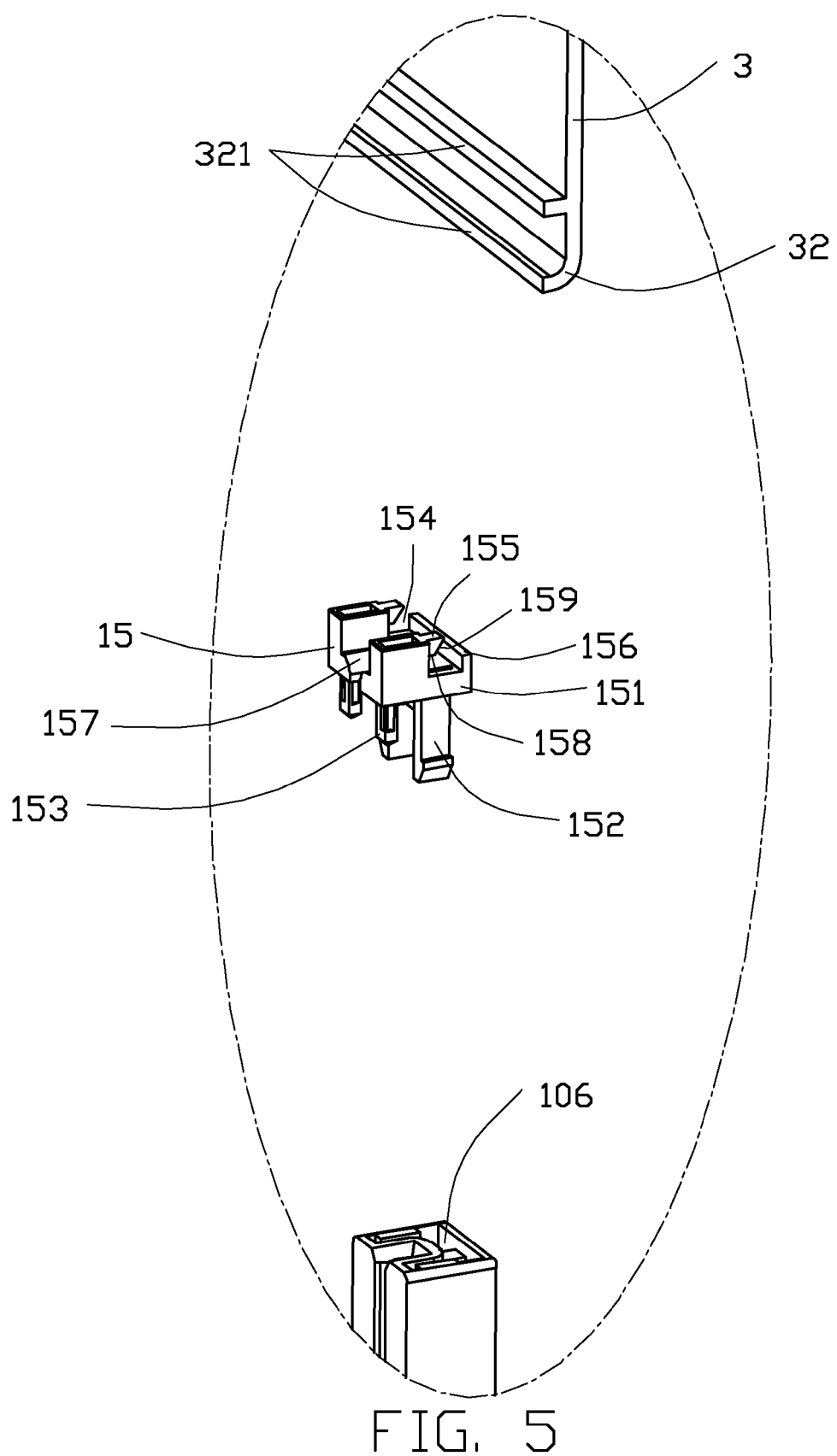
FIG. 5 is a partially enlarged view of the electrical connector assembly shown in FIG. 4.
Figure 6:
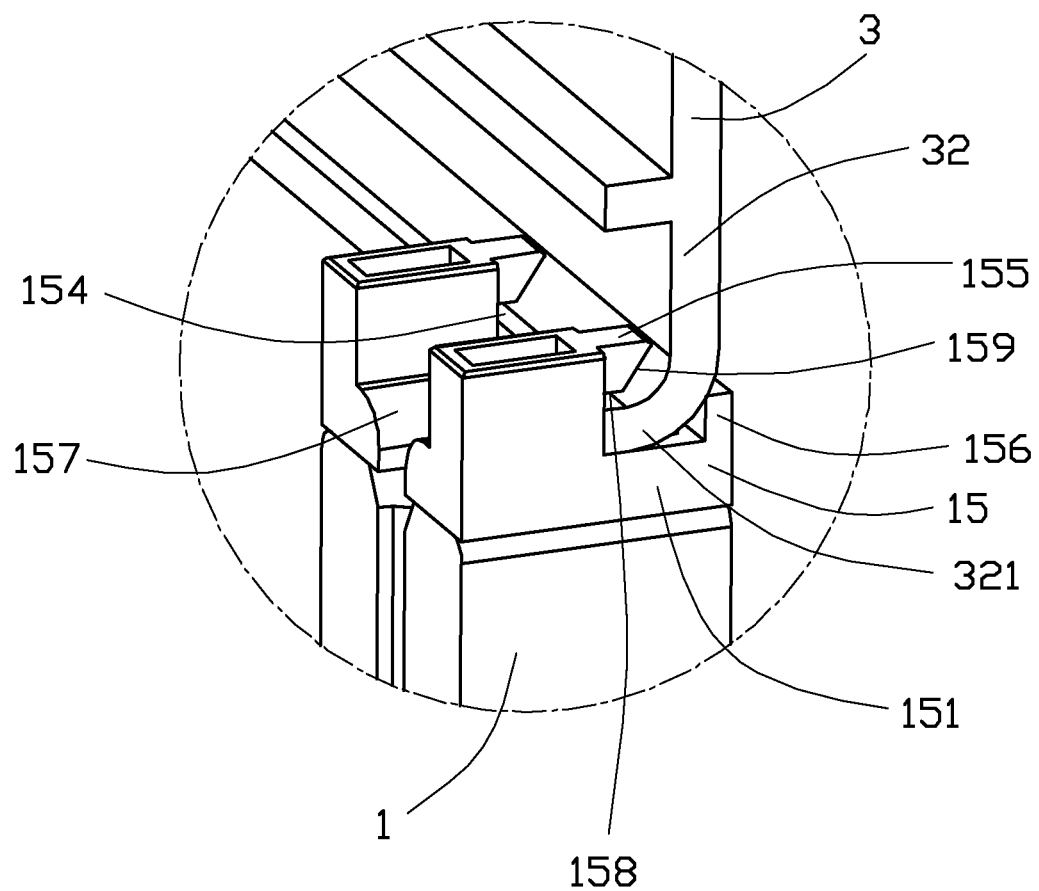
FIG. 6 is a partially enlarged view of the electrical connector assembly shown in FIG. 1.

Referring to FIG. 2 to FIG. 4, the electrical connector 1 includes an elongated insulative housing 10 extending along a left-to-right direction, a plurality of conductive terminals 13 retained in the insulative housing 10, a locking mechanism 14 and a retaining device 15 are retained on opposite end of the insulative housing 10 respectively. The insulative housing 10 defines two opposite elongated side walls 101, two end walls or towers 102 connecting with opposite ends of the side wall 101 and a center slot 103 formed between the two side walls 101 for inserting with the daughter card (not shown). The insulative housing 10 further defines a plurality of terminal passageways 104 communicating with the center slot 103, the conductive terminals 13 is received in the terminal passageways 104 and each of the conductive terminal 13 defines a contacting portion 131 protruding into the center slot 103, a soldering portion 132 extending out of the insulative housing 10 from the contacting portion 131. The end wall 102 is taller than the side wall 101 and forming a tower portion thereof. One of the end wall 102 defines a mounting slot 105 for retaining the locking mechanism 14 which communicate with the center slot 103, the locking mechanism 14 is used for locking and exiting the daughter card (not shown). The retaining device is mounted on another end wall 102.

The locking mechanism 14 is rotatablely retained in the tower portion, and defines a body portion 141, a pair of pivots 142 protruding outwardly from opposite sides of the body portion 141 for positioning the locking mechanism 14 to the mounting slot 105 of the tower portion an ejecting portion 143 inwardly extending from a lower end of the body portion 141 to be under the central slot 103 for ejecting the daughter card (not shown) out of the central slot 103, a locking head 145 extending toward the central slot 103 of the insulative housing 10 from a top end of the body portion 141, and an operating portion 144 outwardly extending from the top end of the body portion 141. The body portion 141 further defines a pair of protrusions 146 extending outwardly from opposite sides thereof to lock with the tower portion (not shown) for locking the locking mechanism 4 in the mounting slot 105 stably.

One of the brackets 3 defines a first locking hook 31 locking with the locking mechanism, the locking hook 31 have a ⊏-shaped shape and defines a pair of retaining walls 311, a holding slot formed between the two retaining walls 311 for retaining the operating portion 144 of the locking mechanism 14.

Referring to FIG. 3 to FIG. 6, the end wall 102 defines a receiving slot 106 for receiving the retaining device 15, the retaining device 15 includes a base portion 151 abuts against the end wall 102, at least one retaining portion 152 and at least one retaining post 153 extend downwardly from the base portion 151, and a retaining slot 154 formed at an upper side of the base portion 151 for receiving the bracket 3. The retaining device 15 defines a first stopping portion 155 located at an upper side of the retaining slot 154 and downwardly abuts against the bracket 3 to prevent the bracket 3 move upwardly and a second stopping portion 156 located at an outer side of the retaining slot 154 and inwardly abuts against the bracket 3 to prevent the bracket 3 from moving outwardly. The retaining portion 152 is immovably fixed in an inner wall (not shown) of the receiving slot 106 and the retaining post are also immovably fixed in the inner wall (not shown) of the receiving slot 106 for increasing the retaining force between the retaining device 15 and the end wall 102. The the first stopping portion 155 and the second stopping portion 156 are extend integrally from the base portion 151 of the retaining device 15 and common form the retaining slot 154. The base portion 151 further includes two adjacent first stopping portion 155 and a slot 157 formed between the two first stopping portion 155, the slot 157 is communicated with the center slot 103 for receiving the daughter card (not shown) to reduce the size of the electrical connector 1.

Another bracket 3 defines a second locking hook 32 locking with the retaining device 15 and second locking hook 32 is received in the retaining slot 154. The first stopping portion 155 abuts against an upper side of the locking hook 32 to prevent the bracket 3 moved upward, the second stopping portion 156 abuts against an outer side of the retaining slot 154 to prevent the bracket 3 moved outward. The end wall 102 defines an end surface 1021 in the left-to-right direction, the retaining slot 154 is located at an interior of the end surface 1021. Thus, when the second locking hook 32 locking with the retaining slot 154, the second locking hook 32 can be controlled at the interior of the end surface 1021, and then the size of the electrical connector 1 in the left-to-right direction can reduce.

The second locking hook 32 has a same shape as the first locking hook 31, the second locking hook 32 defines a pair of retaining walls 321, the two retaining walls 321 are opposite each other in a height direction of the electrical connector 1 and the first stopping portion 155 is retained between the two retaining walls 321. The first stopping portion 155 is a cantilever and defining a horizontal surface 158 and an inclined surface 159, the horizontal surface 158 located at a bottom surface of the first stopping portion 155 and the inclined surface 159 located at a free end of the stopping portion. The inclined surface 159 of the first stopping portion 155 is used for guiding the retaining wall 321 and the horizontal surface 158 is used for abutting against the locking hook 32. As mentioned earlier, the second locking hook 32 is received within the retaining slot 154, and outwardly constrained by the second stopping portion 156. Therefore, by cooperation of the first stopping portion 155 and the second stopping portion 156, the second locking hook 32 can be properly retained in both the vertical direction and the left-to-right direction without possibility of incautious withdrawal from the housing.

Figure 7:
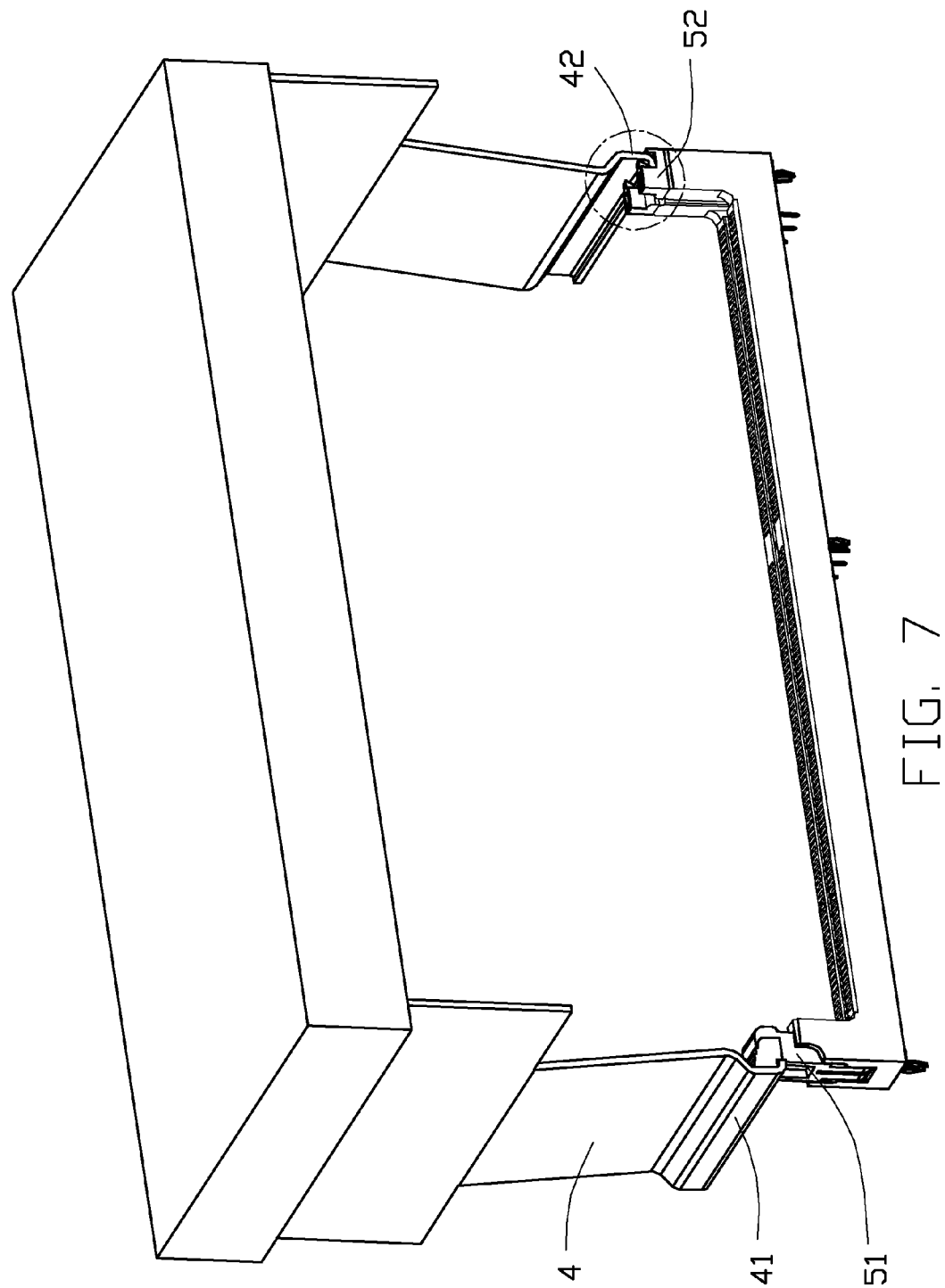
FIG. 7 is a perspective view of an electrical connector assembly in accordance with a second embodiment of the present invention.
Figure 8:
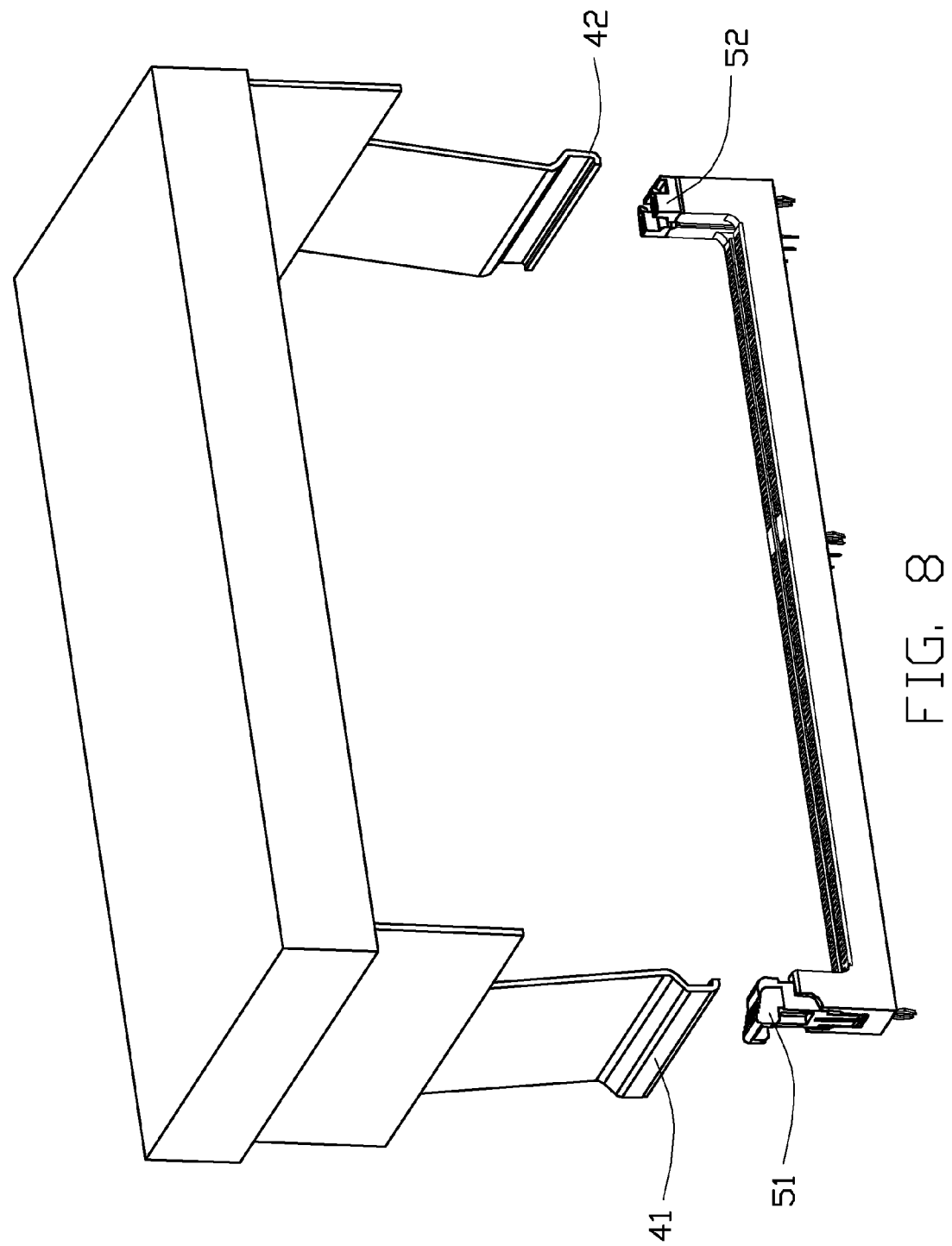
FIG. 8 is an exploded perspective view of the electrical connector assembly shown in FIG. 7.
Figure 9:
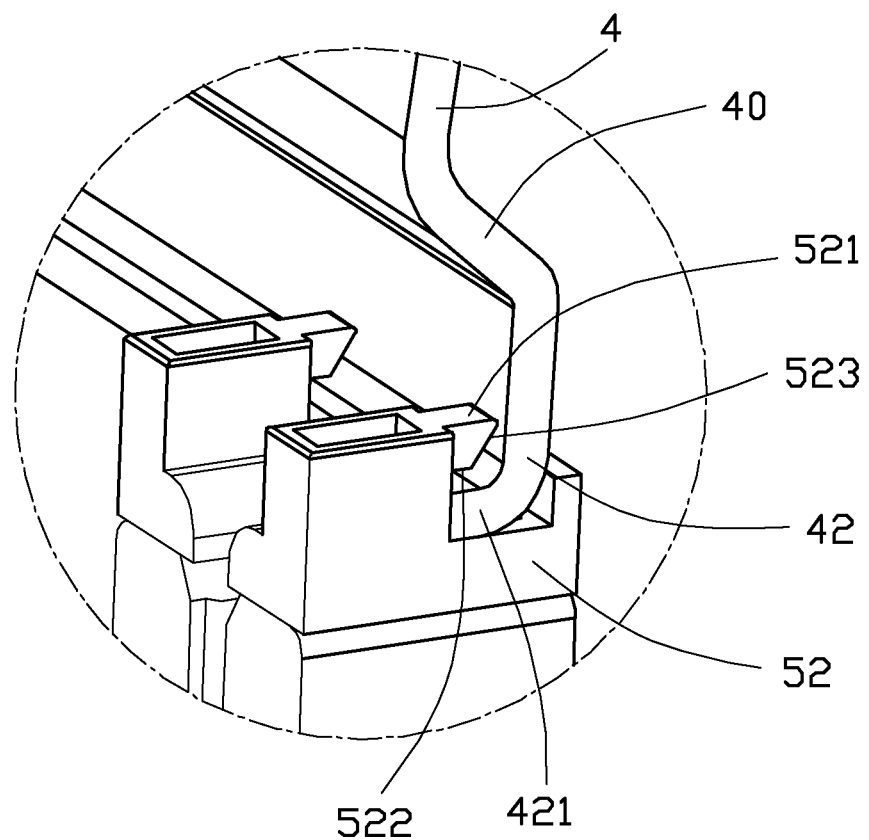
FIG. 9 is a partially enlarged view of the electrical connector assembly shown in FIG. 7.

Referring to FIG. 7 to FIG. 9, an electrical connector assembly (not labeled) in accordance with a second embodiment of the present invention. A pair of brackets 4 used for supporting a fan (no labeled), one of the bracket 4 defines a first locking hook 41 locking with a locking mechanism 51 and another bracket 4 defines a second locking hook 42 locking with a retaining device 52. Each of the brackets 4 defines a bending area 40 bended inward. The retaining device 52 defines a first stopping portion 521 which including a horizontal surface 522 and an inclined surface 522, the second locking hook 42 defines a retaining walls 421 and the retaining walls 421 of the second locking hook 42 not only abuts against the horizontal surface 522 but also abuts against the inclined surface 522.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the board general meaning of the terms in which the appended claims are expressed.

What is claimed is:

1. An electrical connector for use with a daughter card, comprising:
    an insulative housing defining a receiving central slot extending along a longitudinal direction;
    a plurality of contacts disposed in the housing and by two sides of the central slot in a transverse direction perpendicular to said longitudinal direction for receiving the daughter card therein;
    a pair of towers formed at two opposite longitudinal ends of the housing and extending upwardly in a vertical direction perpendicular to both said front-to-back direction and said transverse direction;
    a retaining device located on top of one of said towers and defining a retaining slot in a top portion thereof, an upper side part located intimately above the retaining slot, and an outer side part intimately beside the retaining slot; and
    a bracket for supporting a fan locked with the retaining device and including at a distal end a locking hook; wherein
    said locking hook is snugly received within the retaining slot and prevented from upward moving in the vertical direction by the upper side part and outward moving in the longitudinal direction by the outer side part.

2. The electrical connector as claimed in claim 1, wherein said locking hook defines a retaining wall extending along the longitudinal direction, and the upper side part defines a horizontal surface abutting against the retaining wall in the vertical direction.

3. The electrical connector as claimed in claim 1, wherein the tower defines an end outer surface exposed to an exterior in the longitudinal direction, and the locking hook extends not beyond said end outer surface in the longitudinal direction so as to keep a minimum dimension of the housing along said longitudinal direction after the bracket is assembled to the retaining device.

4. The electrical connector as claimed in claim 1, wherein said retaining device is discrete from the housing and assembled thereto so as to allow the same housing to cooperate with different retaining devices for supporting differently sized fans thereto.

5. The electrical connector as claimed in claim 1, wherein said retaining device defines a slot in alignment with the central slot in the vertical direction for receiving the daughter card therein.

6. The electrical connector as claimed in claim 1, wherein said bracket extends in a vertical plane in the vertical direction.

* * * * *